United States Patent
Pletka et al.

(10) Patent No.: US 10,592,173 B2
(45) Date of Patent: Mar. 17, 2020

(54) INCREASING STORAGE EFFICIENCY OF A DATA PROTECTION TECHNIQUE

(71) Applicant: INTERNATIONAL BUSINESS MACHINES CORPORATION, Armonk, NY (US)

(72) Inventors: Roman A. Pletka, Zurich (CH); Radu I. Stoica, Zurich (CH); Ioannis Koltsidas, Zurich (CH); Nikolas Ioannou, Zurich (CH); Sasa Tomic, Kilchberg (CH); Antonios K. Kourtis, Zurich (CH); Charalampos Pozidis, Thalwil (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/867,265

(22) Filed: Jan. 10, 2018

(65) Prior Publication Data
US 2019/0212949 A1     Jul. 11, 2019

(51) Int. Cl.
| G06F 3/06  | (2006.01) |
| G06F 11/10 | (2006.01) |
| H03M 7/30  | (2006.01) |

(52) U.S. Cl.
CPC ............ *G06F 3/0689* (2013.01); *G06F 3/064* (2013.01); *G06F 3/0604* (2013.01); *G06F 3/0619* (2013.01); *G06F 3/0658* (2013.01); *G06F 3/0688* (2013.01); *G06F 11/1076* (2013.01); *H03M 7/30* (2013.01); *G06F 2212/401* (2013.01)

(58) Field of Classification Search
CPC .. G06F 11/1076; G06F 3/0689; G06F 3/0619; G06F 3/0688; G06F 3/064; G06F 3/0604; G06F 3/0658; G06F 2212/401; H03M 7/30
See application file for complete search history.

(56) References Cited

U.S. PATENT DOCUMENTS

| 5,617,425 A * | 4/1997 | Anderson | ............... G06F 11/00 371/10.2 |
| 5,748,885 A * | 5/1998 | Gallagher | ............... G06F 11/34 395/185.01 |

(Continued)

FOREIGN PATENT DOCUMENTS

WO    2015075837 A1    5/2015

OTHER PUBLICATIONS

Menon, "A Performance Comparison of RAID-5 and Log-Structured Arrays" 1995, IEEE International Symposium on High Performance Distributed Computing, pp. 167-178. (Year: 1995).*

(Continued)

*Primary Examiner* — Larry T MacKall
(74) *Attorney, Agent, or Firm* — Michael R. Long; Wenjie Li

(57) ABSTRACT

A technique for operating a data storage system includes receiving uncompressed data. The uncompressed data is organized into data strips of a stripe. The data strips are compressed subsequent to the organizing. Parity information for the compressed data strips is calculated. Storage of the compressed data strips and the parity information for the stripe is initiated on respective storage devices of the data storage system.

20 Claims, 11 Drawing Sheets

(56) References Cited

U.S. PATENT DOCUMENTS

| | | | | |
|---|---|---|---|---|
| 5,774,643 | A * | 6/1998 | Lubbers et al. | G06F 11/10 395/182.18 |
| 6,532,121 | B1 * | 3/2003 | Rust et al. | G11B 5/00 360/8 |
| 7,970,995 | B2 | 6/2011 | Watanabe et al. | |
| 9,465,561 | B2 | 10/2016 | Nishina et al. | |
| 9,477,420 | B2 | 10/2016 | Yadav et al. | |
| 9,672,107 | B1 | 6/2017 | Horn | |
| 9,916,248 | B2 | 3/2018 | Sugimoto et al. | |
| 2002/0035667 | A1 * | 3/2002 | Bruning, III et al. | G06F 12/00 711/114 |
| 2002/0046322 | A1 * | 4/2002 | Butterworth et al. | G06F 13/00 711/114 |
| 2002/0069317 | A1 * | 6/2002 | Chow et al. | G06F 13/00 711/104 |
| 2002/0118582 | A1 * | 8/2002 | Butterworth et al. | G11C 29/00 365/200 |
| 2003/0120864 | A1 * | 6/2003 | Lee et al. | G06F 12/00 711/114 |
| 2003/0236944 | A1 * | 12/2003 | Thompson et al. | G06F 12/00 711/114 |
| 2004/0085723 | A1 * | 5/2004 | Hartung | G06F 12/00 361/684 |
| 2005/0235080 | A1 * | 10/2005 | El-Batal | G06F 13/38 710/74 |
| 2008/0168304 | A1 * | 7/2008 | Flynn et al. | G06F 11/08 714/7 |
| 2009/0055451 | A1 | 2/2009 | Reimer et al. | |
| 2009/0164693 | A1 * | 6/2009 | Andersen | G06F 13/20 710/313 |
| 2010/0325523 | A1 * | 12/2010 | Slyz | G06F 8/65 714/773 |
| 2013/0242656 | A1 * | 9/2013 | Sakaue | G06F 11/1048 365/185.09 |
| 2014/0101479 | A1 * | 4/2014 | Galbraith et al. | G06F 11/20 714/6.2 |
| 2014/0297973 | A1 * | 10/2014 | Miyamae | G06F 12/02 711/154 |
| 2016/0004642 | A1 * | 1/2016 | Sugimoto | G06F 3/06 711/128 |
| 2017/0286220 | A1 * | 10/2017 | Gerhard et al. | G06F 11/1076 |
| 2018/0088812 | A1 | 3/2018 | Lee | |

OTHER PUBLICATIONS

Gopinath et al., "A 3-Tier RAID Storage System with RAID1, RAID5 and Compressed RAID5 for Linux," Proceeding of FREENIX Track: 2000 USENIX Annual Technical Conference, Jun. 2000, USENIX.

* cited by examiner

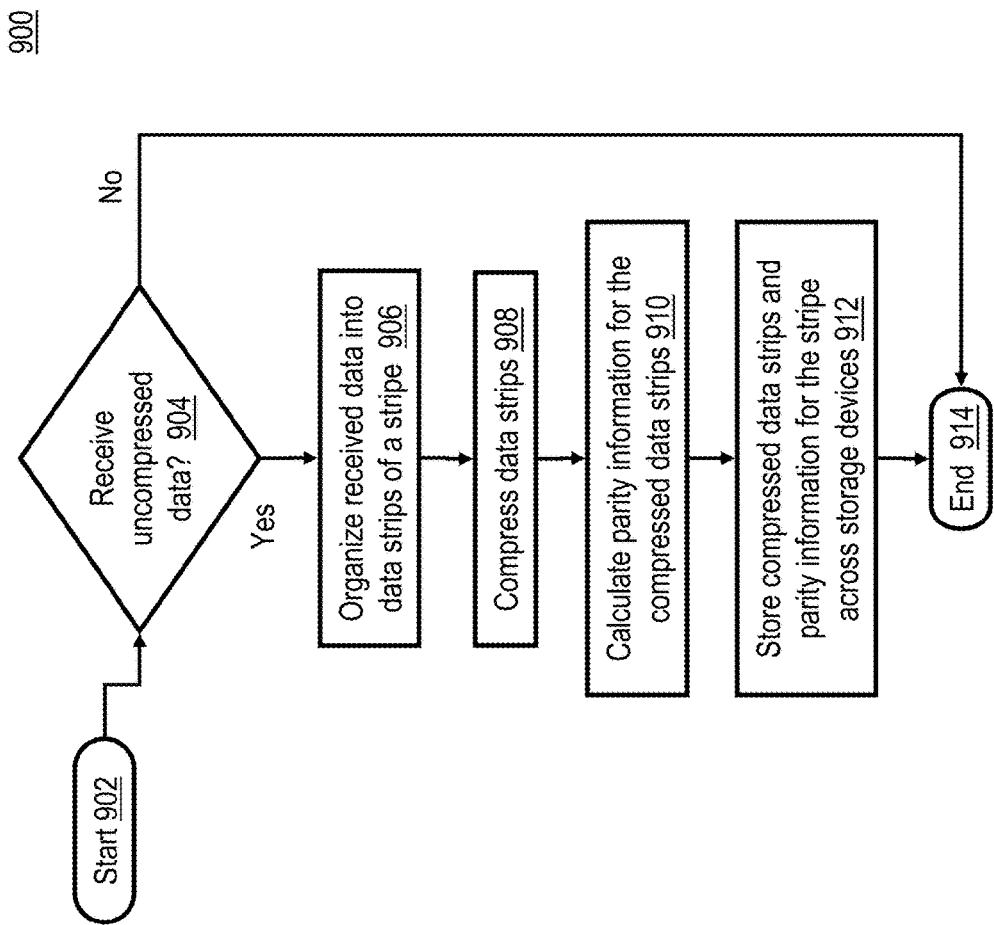

INCREASING STORAGE EFFICIENCY OF A DATA PROTECTION TECHNIQUE

BACKGROUND OF THE INVENTION

This disclosure relates to data processing and storage and, more specifically, to increasing storage efficiency of a data protection technique in a data storage system.

NAND flash memory is an electrically programmable and erasable non-volatile memory technology that stores one or more bits of data per memory cell as a charge on the floating gate of a transistor or a similar charge trap structure. In a typical implementation, a NAND flash memory array is organized in blocks (also referred to as "erase blocks") of physical memory, each of which includes multiple physical pages each in turn containing a multiplicity of memory cells. By virtue of the arrangement of the word and bit lines utilized to access memory cells, flash memory arrays can generally be programmed on a page basis, but are erased on a block basis.

As is known in the art, blocks of NAND flash memory must be erased prior to being programmed with new data. A block of NAND flash memory cells is erased by applying a high positive erase voltage pulse to the p-well bulk area of the selected block and by biasing to ground all of the word lines of the memory cells to be erased. Application of the erase pulse promotes tunneling of electrons off of the floating gates of the memory cells biased to ground to give them a net positive charge and thus transition the voltage thresholds of the memory cells toward the erased state. Each erase pulse is generally followed by an erase verify operation that reads the erase block to determine whether the erase operation was successful, for example, by verifying that less than a threshold number of memory cells in the erase block have been unsuccessfully erased. In general, erase pulses continue to be applied to the erase block until the erase verify operation succeeds or until a predetermined number of erase pulses have been used (i.e., the erase pulse budget is exhausted).

A NAND flash memory cell can be programmed by applying a positive high program voltage to the word line of the memory cell to be programmed and by applying an intermediate pass voltage to the memory cells in the same string in which programming is to be inhibited. Application of the program voltage causes tunneling of electrons onto the floating gate to change its state from an initial erased state to a programmed state having a net negative charge. Following programming, the programmed page is typically read in a read verify operation to ensure that the program operation was successful, for example, by verifying that less than a threshold number of memory cells in the programmed page contain bit errors. In general, program and read verify operations are applied to the page until the read verify operation succeeds or until a predetermined number of programming pulses have been used (i.e., the program pulse budget is exhausted).

BRIEF SUMMARY

A technique for operating a data storage system includes receiving uncompressed data. The received uncompressed data is organized into data strips of a stripe. The data strips are compressed subsequent to the organizing. Parity information for the compressed data strips is calculated. Storage of the compressed data strips and the parity information for the stripe is initiated on respective storage devices of the data storage system.

The disclosed techniques may be implemented as a method, a data storage system, and/or a program product (including program code stored in a storage device).

BRIEF DESCRIPTION OF THE SEVERAL VIEWS OF THE DRAWINGS

FIG. 9 is a high level logical flowchart of an exemplary process for increasing storage efficiency of a data protection technique in accordance with an embodiment of the present disclosure.

DETAILED DESCRIPTION

Figure 1A:
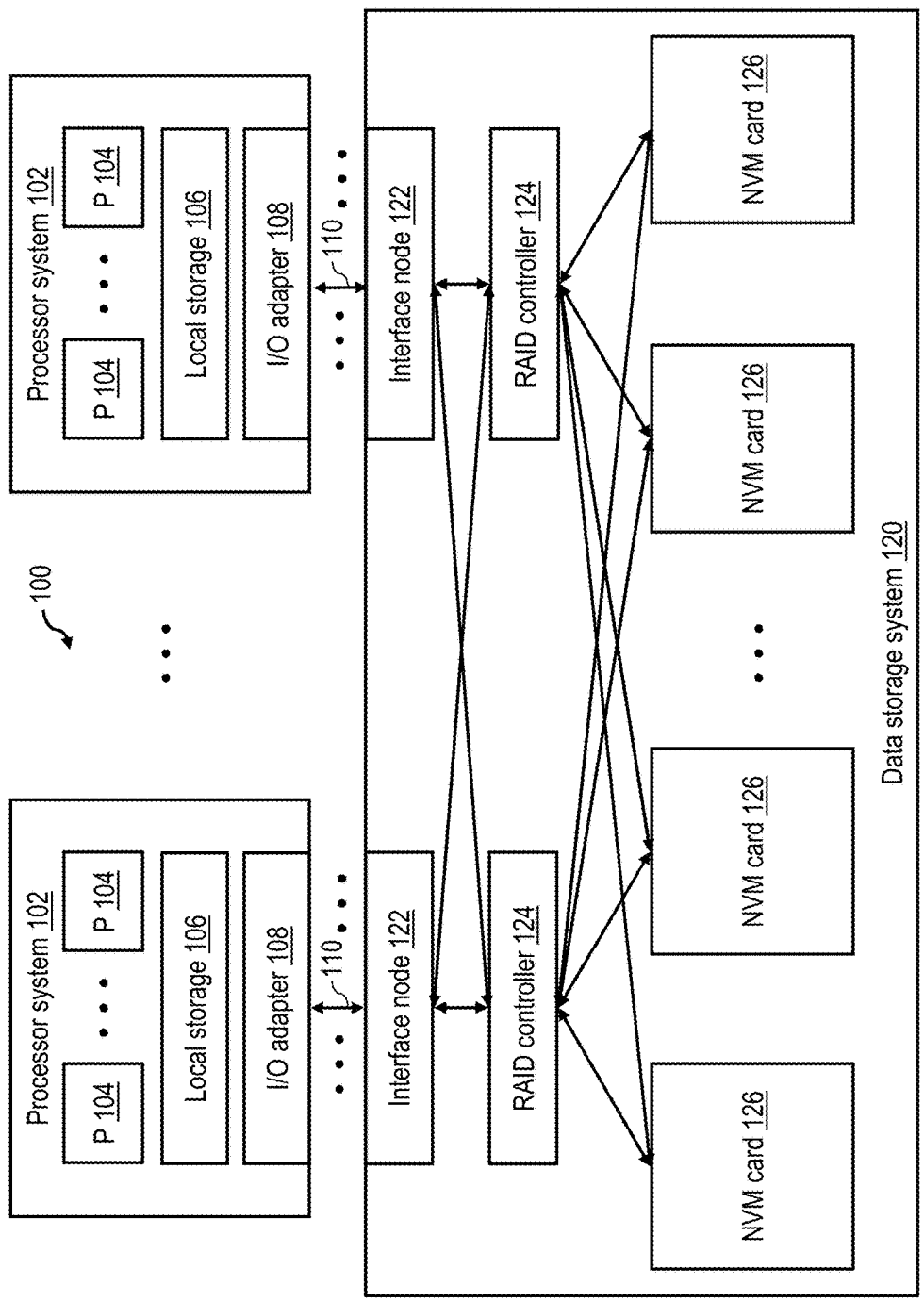
FIG. 1A is a high level block diagram of a data processing environment in accordance with one embodiment.

In data storage systems that have implemented a Redundant Array of Independent Disks (RAID) technology on user data before compressing the user data (i.e., parity computed before compression), a RAID engine has created fixed size RAID stripes that include multiple data blocks (strips) and computed parity on the data strips to generate one or more parity blocks (strips). It should be appreciated that a data block as described here does not relate to a block of NAND flash storage. The data and parity strips have then been compressed prior to being stored on a storage device. In comparison to data strips, parity strips typically have a relatively low compression ratio and, as such, generally decrease overall data reduction. The fact that parity strips have a relatively low compression ratio is especially problematic when storage device count for a stripe is relatively low (e.g., a storage device count of ten or less) and user data is highly compressible (e.g., a 3 to 1 compression ratio or greater), as a storage device that stores a parity strip becomes full well before storage devices that store user data which limits an amount of user data that can be stored on the storage devices that store data strips in the stripe. Moreover, depending on the RAID technology implemented overall data reduction in a data storage system may be further adversely affected. As one example, compression loss on the parity doubles when implementing a RAID 6 technology as compared to a RAID 5 technology leading to a further decrease in overall data reduction in a data storage system.

In data storage systems that have implemented a RAID technology on user data after compressing the user data (i.e., parity computed after compression), storing uncompressible parity strips is avoided as user data is compressed above the RAID engine. However, compressing user data above a RAID engine results in additional complexity and may not be desirable for a variety of reasons. As one example, compressing user data above a RAID engine requires user data to be compressed/decompressed either in software (which leads to higher processor overhead and increased latency) or with hardware assists (which generally prevents streaming and, as such, also increases latency).

To better facilitate compression above a RAID engine, a Log-Structured Array (LSA) may be implemented to organize user data in a storage controller above a RAID engine. However, employing an LSA to organize user data in a storage controller above a RAID engine generally results in higher overhead (as additional metadata must be maintained) and is generally less scalable than distributed LSA implemented in storage devices of the data storage system. That is, in a data storage system that performs compression before RAID parity calculation, compression of each data block must complete before the RAID parity calculation which adds additional latency that can only be hidden if additional data protection is used (e.g., by maintaining a second copy of user data on a different node). In data storage system architectures where a RAID parity calculation after compression is supported in a storage controller and storage devices also support internal compression then compression functionality in the storage controller or the storage devices is superfluous and the drawbacks of a selected compression approach remain.

Embodiments of the present disclosure are applicable to data storage systems that implement a centralized RAID engine and to data storage systems where a client implements LSA and RAID functionality is distributed across storage devices. According to the present disclosure, an implemented data protection technique may operate on views of user data at different levels. In various embodiments, a logical view of user data (i.e., uncompressed user data from a client) is used to create RAID stripes (i.e., a RAID technology decides what user data is assigned to what data strip). After a RAID stripe is created, compression is applied to data strips before calculating parity. The data strips are therefore transformed by compression (physical view of the data) and may no longer be of equal size. For parity calculations, smaller compressed data strips are padded with zeroes such that all compressed data strips are a same size as a largest compressed data strip. Parity is then computed on the compressed data strips and a parity strip is created that is equal in size to the largest compressed data strip. It should be appreciated that padding is usually only used for the parity calculation and is not usually stored in the storage devices.

It should be appreciated that maintaining parity on variable sized strips complicates stripe updates and recovery, as changing a logical page can result in a size change of compressed data and parity strips (which is one reason why conventional RAID implementations utilize fixed sized strips when calculating parity). In general, a compression ratio achieved by the disclosed techniques is somewhere between the compression ratios of conventional approaches for calculating parity before compression and conventional approaches for calculating parity after compression. In general, an efficiency gain realized by the disclosed techniques depends on the variability of the compression ratios of the data strips in a stripe. If the data strips have a similar compression ratio, the disclosed techniques are substantially the same as the conventional case of compression before parity (best case). If one data strip in a stripe is uncompressible while all the other data strips in the stripe are highly compressible, the storage efficiency of the disclosed techniques are substantially the same as the conventional case of parity before compression. Implementing a higher-level LSA can be leveraged to reduce compression variability of data strips in a stripe by distributing the same amount of compressible data to all storage devices in a RAID array.

With reference to the figures and with particular reference to FIG. 1A, there is illustrated a high level block diagram of an exemplary data processing environment 100 including a data storage system 120 that is configured to generally increase efficiency of an implemented data protection technique according to the present disclosure. As shown, data processing environment 100 includes one or more hosts, such as a processor system 102 having one or more processors 104 that process instructions and data. Processor system 102 may additionally include local storage 106 (e.g., Dynamic Random Access Memory (DRAM) or disks) that may store program code, operands and/or execution results of the processing performed by processor(s) 104. In various embodiments, processor system 102 can be, for example, a mobile calculating device (such as a smartphone or tablet), a laptop or desktop personal computer system, a server computer system (such as one of the POWER® series available from International Business Machines Corporation), or a mainframe computer system. Processor system 102 can also be an embedded processor system using various processors such as ARM®, POWER, Intel X86, or any other processor combined with memory caches, memory controllers, local storage, Input/Output (I/O) bus hubs, etc.

Each processor system 102 further includes an I/O adapter 108 that is coupled directly (i.e., without any intervening device) or indirectly (i.e., through at least one intermediate device) to a data storage system 120 via an I/O channel 110. In various embodiments, an I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), Non-volatile Memory Express (NVMe), NVMe over Fabrics, etc. I/O operations (IOPs) communicated via I/O channel 110 include read IOPs by which a processor system 102 requests data from data storage system 120 and write IOPs by which a processor system 102 requests storage of data in data storage system 120.

In the illustrated embodiment, data storage system 120 includes multiple interface nodes 122 through which data storage system 120 receives and responds to IOPs via I/O channels 110. Each interface node 122 is coupled to each of multiple outer Redundant Array of Independent Disks (RAID) controllers 124 in order to facilitate fault tolerance and load balancing. Each of outer RAID controllers 124 is in turn coupled (e.g., by a PCIe bus) to each of multiple NVM cards 126 including, in this example, NVM storage media. In other embodiments, other lossy storage media can be employed.

Figure 1B:
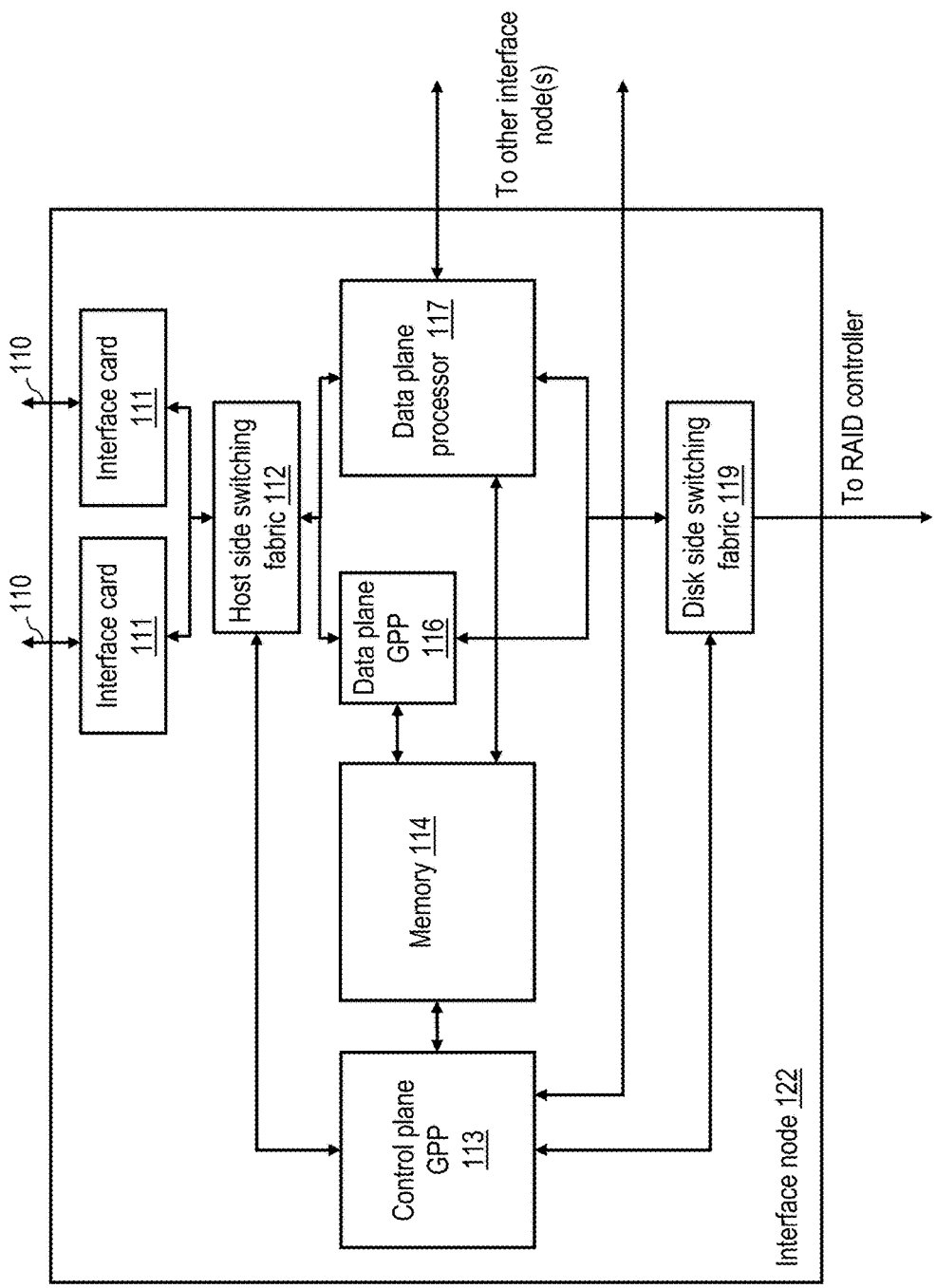
FIG. 1B is a more detailed block diagram of an exemplary interface node of a data storage system of FIG. 1A.

FIG. 1B depicts a more detailed block diagram of an interface node 122 of data storage system 120 of FIG. 1A. Interface node 122 includes one or more interface cards 111 that serve as an interface to processor systems 102 through I/O channels 110 and connect to host side switching fabric 112. The host side switching fabric 112 acts as a switch and handles all data transfers between interface cards 111 and processing units in interface node 122, namely control plane general purpose processor (GPP) 113, data plane GPP 116, and data plane processor 117. Typically, host side switching fabric 112 consist of a PCIe switch, but other switch technologies may be used as well. In one or more embodiments, data plane processor 117 is a special purpose processor that can be implemented, for example, by an Application Specific Integrated Circuit (ASIC) or a Field Programmable Gate Array (FPGA). Control plane GPP 113, data plane GPP 116, and data plane processor 117 are all connected to memory 114 which may be implemented as a shared memory between these components, separate memories, or a combination thereof.

In embodiments in which data plane processor 117 is implemented with an FPGA, control plane GPP 113 may program and configure data plane processor 117 during start-up of data storage system 120. Data plane GPP 116 and control plane GPP 113 control data plane processor 117 as well as access to NVM cards 126 either indirectly through the control of data plane processor 117 or directly through disk side switching fabric 119. Control plane GPP 113 executes system management functions as well as higher level services such as snapshots, thin provisioning, and deduplication. Data plane GPP 116 executes protocol specific functions. Control plane GPP 113, data plane GPP 116, and data plane processor 117 are connected to outer RAID controller 124 through disk side switching fabric 119 which typically consist of a PCIe switch, but other switch technologies may be used as well. FIG. 1B further illustrates control plane GPP 113 and data plane processor 117 being connected to other interface nodes 122 in data storage system 120 to handle fail-over scenarios or for performing other data synchronization functions.

Figure 1C:
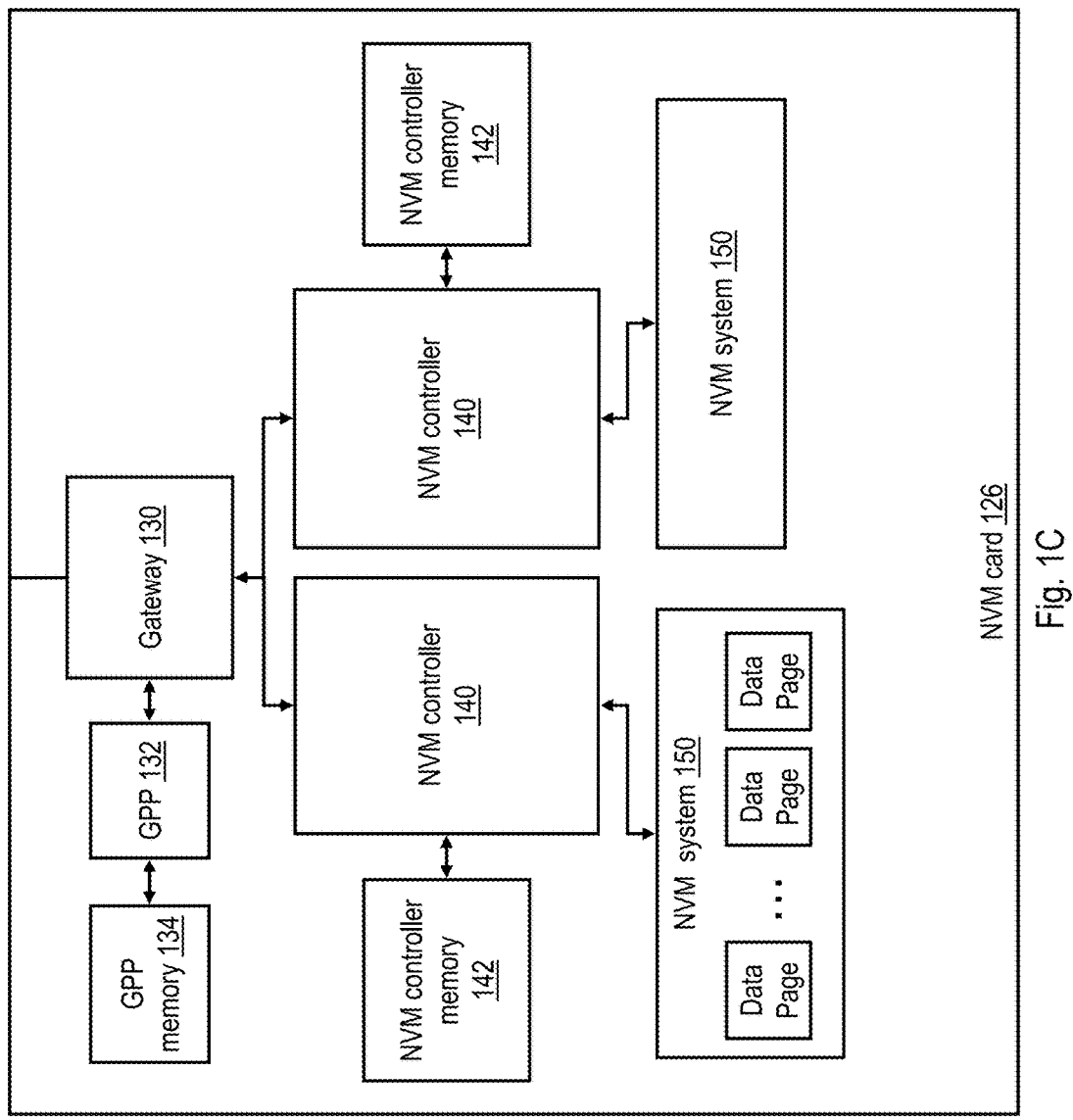
FIG. 1C is a more detailed block diagram of an exemplary non-volatile memory (NVM) card of the data storage system of FIG. 1A.

FIG. 1C depicts a more detailed block diagram of an NVM card 126 of data storage system 120 of FIG. 1A. NVM card 126 includes a gateway 130 that serves as an interface between NVM card 126 and outer RAID controllers 124. Gateway 130 is coupled to a general-purpose processor (GPP) 132, which can be configured (e.g., by program code) to perform various management functions, such as pre-processing of IOPs received by gateway 130 and/or to schedule servicing of the IOPs by NVM card 126. GPP 132 is coupled to a GPP memory 134 (e.g., Dynamic Random Access Memory (DRAM) or Magneto-resistive Random Access Memory (MRAM)) that can conveniently buffer data created, referenced, and/or modified by GPP 132 in the course of its processing.

Gateway 130 is further coupled to multiple NVM controllers 140, each of which controls a respective NVM system 150. The NVM controllers 140 may implement combined ECC/RAID data protection techniques for a NVM array. NVM controllers 140 can be implemented, for example, by an Application Specific Integrated Circuit (ASIC) or a Field Programmable Gate Array (FPGA) having an associated NVM controller memory 142 (e.g., DRAM). In embodiments in which NVM controllers 140 are implemented with an FPGA, GPP 132 may program and configure NVM controllers 140 during start-up of data storage system 120. After startup, in general operation NVM controllers 140 receive read and write IOPs from gateway 130 that request to read data stored in NVM system 150 and/or to store data in NVM system 150. NVM controllers 140 service these IOPs, for example, by accessing NVM systems 150 to read or write the requested data from or into NVM systems 150 or by accessing one or more read and/or write caches (not illustrated in FIG. 1C) associated with NVM systems 150.

NVM controllers 140 implement a translation layer that provides logical-to-physical address translation to enable access to specific memory locations within NVM systems 150. In general, an IOP received by NVM controller 140 from a host device, such as a processor system 102, contains the logical block address (LBA) at which the data is to be accessed (read or written) and, if a write IOP, the write data to be written to data storage system 120. The IOP may also specify the amount (or size) of the data to be accessed. Other information may also be communicated depending on the protocol and features supported by data storage system 120. The LBA provided by the host device corresponds to a logical page within a logical address space, the logical page typically having a size in the range between 512 bytes to four (4) kilobytes or more. The translation layer translates this LBA into a physical address assigned to a corresponding physical location in a NVM system 150.

NVM controllers 140 may perform address translation and/or store mappings between logical and physical addresses in a logical-to-physical translation data structure, such as a logical-to-physical translation (LPT) table, which may conveniently be stored in NVM controller memory 142. An LPT table may also be configured to store compressed page sizes of data pages stored in NVM system 150 and even further their CRC values.

Having described the general physical structure and operation of one exemplary embodiment of a data storage system 120, certain operational aspects of data storage system 120 are now described with reference to FIG. 2, which is a high level flow diagram of the flash management functions and data structures employed by GPP 132 and/or NVM controllers 140 in accordance with one embodiment.

As noted above, data storage system 120 does not generally allow external devices to directly address and/or access the physical memory locations within NVM systems 150. Instead, data storage system 120 is generally configured to present a single contiguous logical address space to the external devices, thus allowing host devices to read and write data to and from LBAs within the logical address space while permitting NVM controllers 140 and GPP 132 to control where the data that is associated with the various LBAs actually resides in the physical memory locations comprising NVM systems 150. In this manner, performance and longevity of NVM systems 150 can be intelligently managed and optimized. In the illustrated embodiment, each NVM controller 140 manages the logical-to-physical translation using a logical-to-physical translation data structure, such as logical-to-physical translation (LPT) table 200, which can be stored in the associated flash controller memory 142. An LPT table, such as LPT table 200, can also be configured to store compressed page sizes of data pages stored in NVM systems 150 and/or other metadata to aid in data deduplication.

Flash management code running on the GPP 132 tracks erased blocks of NVM system 150 that are ready to be used in ready-to-use (RTU) queues 206, which may be stored, for example, in GPP memory 134. In the depicted embodiment, management code running on the GPP 132 preferably maintains one or more RTU queues 206 per channel, and an identifier of each erased block that is to be reused is enqueued in one of RTU queues 206 corresponding to its channel. For example, in one embodiment, RTU queues 206 include, for each channel, a respective RTU queue 206 for each of a plurality of block health grades. In various implementations, between 2 and 8 RTU queues 206 per lane (and a corresponding number of block health grades) have been found to be sufficient.

A build block stripes function 220 performed by flash management code running on GPP 132 may be implemented to construct new block stripes for storing data and associated parity information from the erased blocks enqueued in RTU queues 206. Block stripes are preferably formed of blocks of the same or similar health (i.e., expected remaining useful life) residing in different channels, meaning that build block stripes function 220 can conveniently construct a block stripe by drawing each block of the new block stripe from corresponding RTU queues 206 of different channels. The new block stripe is then queued to NVM controller 140 for data placement.

In response to a write IOP received from a host, such as a processor system 102, a data placement function 210 of NVM controller 140 determines by reference to LPT table 200 whether the target LBA(s) indicated in the write request is/are currently mapped to physical memory page(s) in NVM system 150 and, if so, changes the status of each data page currently associated with a target LBA to indicate that it is no longer valid. In addition, data placement function 210 allocates a page stripe if necessary to store the write data of the write IOP and any non-updated data (i.e., in case the write request is smaller than a logical page, there is still valid data which needs to be handled in a read-modify-write manner) from an existing page stripe, if any, targeted by the write IOP, and/or stores the write data of the write IOP and any non-updated (i.e., still valid) data from an existing page stripe, if any, targeted by the write IOP to an already allocated page stripe which has free space left. The page stripe may be allocated from either a block stripe already allocated to hold data or from a new block stripe built by build block stripes function 220. In one embodiment, the page stripe allocation can be based on the health of the blocks available for allocation and the "heat" (i.e., estimated or measured write access frequency) of the LBA of the write data. Data placement function 210 then writes the write data, associated metadata (e.g., CRC and ECC values), for each codeword in each page of the page stripe, and parity information for the page stripe in the allocated page stripe. The associated metadata and parity information can be written to storage as soon as enough host data has been placed into the page stripe. NVM controller 140 also updates LPT table 200 to associate the physical page(s) utilized to store the write data with the LBA(s) indicated by the host device. Thereafter, NVM controller 140 can access the data to service host read IOPs by reference to LPT table 200 as further illustrated in FIG. 2.

Once all pages in a block stripe have been written, NVM controller 140 places the block stripe into one of occupied block queues 202, which flash management code running on GPP 132 utilizes to facilitate garbage collection. As noted above, through the write process, pages are invalidated, and therefore portions of NVM 150 become unused. An associated NVM controller 140 (and/or GPP 132) eventually needs to reclaim this space through garbage collection performed by a garbage collector 212. Garbage collector 212 selects particular block stripes for garbage collection based on a number of factors including, for example, the health of the blocks within the block stripes and how much of the data within the erase blocks is invalid. In the illustrated example, garbage collection is performed on entire block stripes, and flash management code running on GPP 132 logs the block stripes ready to be recycled in a relocation queue 204, which can conveniently be implemented in the associated flash controller memory 142 or GPP memory 134.

The NVM management functions performed by GPP 132 or NVM controller 140 additionally include a relocation function 214 that relocates the still valid data held in block stripes enqueued in relocation queue 204. To relocate such data, relocation function 214 issues relocation write requests to data placement function 210 to request that the data of the old block stripe be written to a new block stripe in NVM system 150. In addition, relocation function 214 updates LPT table 200 to remove the current association between the logical and physical addresses of the data and to replace it with the new association. Once all still valid data has been moved from the old block stripe, the old block stripe is passed to dissolve block stripes function 216, which decomposes the old block stripe into its constituent blocks, thus disassociating the blocks. NVM controller 140 then erases each of the blocks formerly forming the dissolved block stripe and increments an associated program/erase (PE) cycle count for the block in PE cycle counts 244. Based on the health metrics of each erased block, each erased block is either retired (i.e., no longer used to store user data) by a block retirement function 218 among the flash management functions executed on GPP 132, or alternatively, prepared for reuse by placing the block's identifier on an appropriate ready-to-use (RTU) queue 206 in associated GPP memory 134.

Figure 2:
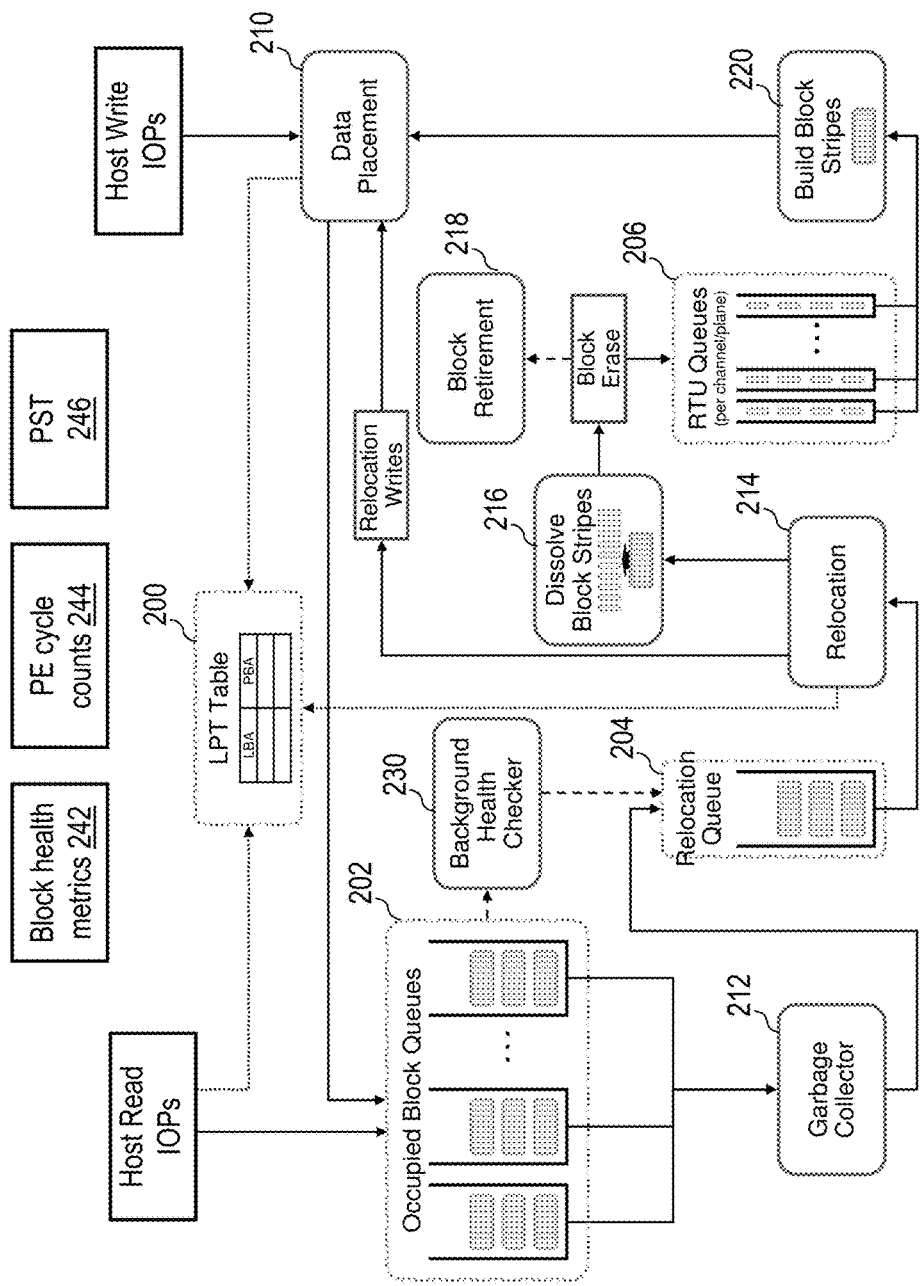
FIG. 2 is a high level flow diagram of the Flash management functions and data structures employed by an NVM controller in accordance with one embodiment.

As further shown in FIG. 2, NVM management functions executed on GPP 132 include a Background Health Checker (BGHC) 230. BGHC 230, which operates independently of the demand read and write IOPs of hosts such as processor systems 102, continuously determines one or more block health metrics 242 for blocks belonging to block stripes recorded in occupied block queues 202. Based on the one or more of block health metrics 242, BGHC 230 may place block stripes on relocation queue 204 for handling by relocation function 214.

Figure 3:
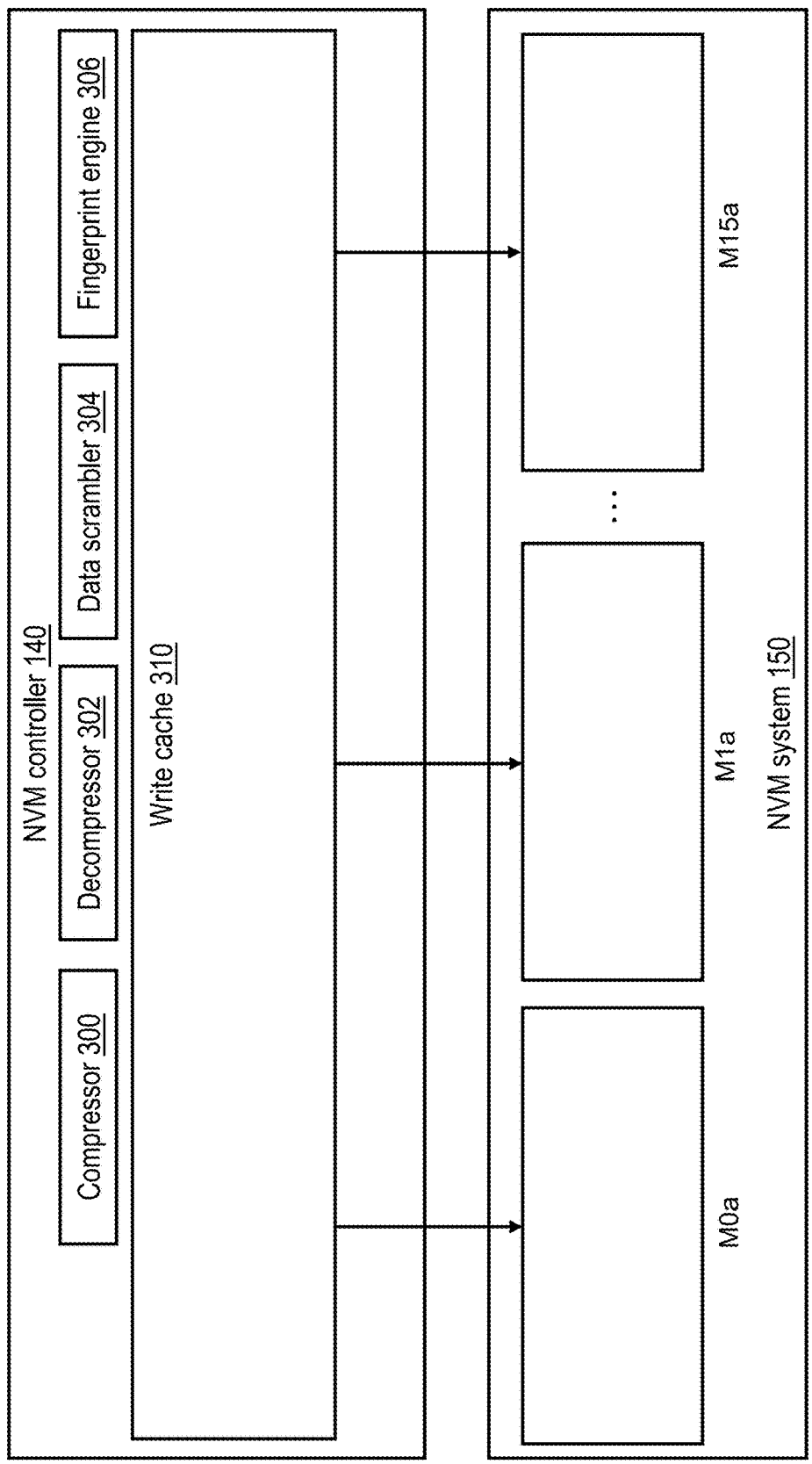
FIG. 3 depicts a more detailed view of an exemplary NVM controller and an exemplary NVM system of FIG. 1C.

NVM systems 150 may take many forms in various embodiments. Referring now to FIG. 3, there is depicted one exemplary arrangement of physical memory within a NVM system 150 in accordance with one exemplary embodiment.

NVM system 150 may be formed from thirty-two (32) individually addressable NVM storage devices, which will be referred to as packages. In the illustrated example, each of the NVM storage devices M0a-M15b takes the form of a board-mounted NVM module capable of storing one, two or more bits per cell. Thus, NVM modules may be implemented with Single Level Cell (SLC), Multi-Level Cell (MLC), Three Level Cell (TLC), Quad Level Cell (QLC) memory, or another type of NVM. The thirty-two NVM modules are arranged in sixteen groups of two, (M0a, M0b) through (M15a, M15b). For purposes of the physical addressing scheme, each group of two modules forms a "lane," also sometimes referred to as a "channel," such that NVM system 150 includes sixteen channels or lanes (Lane0-Lane15).

In one embodiment, each of the individual lanes has a respective associated bus coupling it to the associated NVM controller 140. Thus, by directing its communications to one of the specific communication buses, NVM controller 140 can direct its communications to one of the lanes of memory modules. Because each communication bus for a given lane is independent of the communication buses for the other lanes, a NVM controller 140 can issue commands and send or receive data across the various communication buses at the same time, enabling the NVM controller 140 to access the NVM modules corresponding to the individual lanes at, or very nearly at, the same time.

In the illustrated embodiment, NVM controller 140 includes a compressor 300 that selectively applies one or more data compression algorithms to data written to the associated NVM system 150, a decompressor 302 that decompresses compressed data read from NVM system 150, and a data scrambler 304. NVM controller 140 utilizes data scrambler 304 to apply a predetermined data scrambling (i.e., randomization) pattern to data written to NVM system 150 in order to improve endurance.

As further illustrated in FIG. 3, NVM controller 140 includes a write cache 310. Write cache 310 includes storage for one or more cache lines for buffering write data in anticipation of writing the data to NVM system 150.

Conventional data storage system architectures (including Storage Area Network (SAN) and Network Attached Storage (NAS) solutions) have typically relied on a centralized storage controller that receives and distributes Input/Output (I/O) requests across an array of storage devices (e.g., Hard Disk Drives (HDDs), Solid State Drives (SSDs), Flash Card Modules (FCMs)). In a conventional data storage system, a storage controller has been configured to distribute data across an array of storage devices utilizing a data protection technology (e.g., a Redundant Array of Independent Disks (RAID) technology) so that the storage system can withstand the failure of at least one of the storage devices. In a conventional storage system, a storage controller has also been configured to transparently reconstruct lost data in the event of a storage device failure. Conventional storage system architectures, however, have limitations that become problematic when solid state storage devices, that are capable of much higher data rates than hard disk drives, are implemented.

Conventional data storage system architectures have typically protected data against sector errors and failures of whole physical drives by using RAID technologies, implemented by a RAID engine (e.g., located in a RAID controller). In one or more data storage system architectures, a RAID engine has been implemented in a storage controller to organize data into stripes that span a set of storage devices. Each stripe spans 'n' storage devices and includes 'n' minus 'p' data strips and 'p' parity strips (e.g., for RAID 5, p=1; and for RAID 6, p=2). In conventional data storage system architectures, data and parity strips have typically been the same size (i.e., a size of data and parity strips has been defined by a size of a stripe and a number of storage devices used for the stripe) and each of the data and parity strips has been stored on a different storage device.

Parity information, which has been computed using various techniques (e.g., exclusive OR (XOR) operations, addition and multiplication in a particular Galois field, or Reed-Solomon error correction), has typically been significantly less compressible than actual data. As previously mentioned, at least one conventional data storage architecture has performed compression above a RAID engine (i.e., data is compressed prior to assigning data to storage devices of a storage system by the RAID engine). In data storage architectures that perform compression above a RAID engine, the compression operation has usually resulted in a performance bottleneck that limits read and write bandwidth and increases latency. In an attempt to reduce parity update overhead in the presence of non-sequential small writes, at least some storage architectures that have performed compression above a RAID engine have also organized data into a Log-Structured Array (LSA) prior to compressing the data. However, organizing data into an LSA introduces additional complexity in a storage system and does not mitigate the performance bottleneck that results from performing compression above a RAID engine.

In general, Flash-based SSDs benefit from sequential write patterns, such as write patterns produced by LSA data organization (in which user data is packed into logical segments appended to a global log structure that may span multiple devices). With LSA data organization, as user write operations enter a storage system, data associated with the write operations are packed into relatively large segments. In a typical implementation, each segment is a multiple of a logical erase block (LEB) size of an underlying storage device. When a segment is full, the segment is de-staged to an SSD as a single sequential write operation. It should be appreciated that packing logical data into segments requires remapping of logical data pages to physical storage locations.

As one example, a mapping table (e.g., a Logical-to-Physical Translation (LPT) table) may be implemented to keep track of which physical location corresponds to a given logical address. For example, a unit of user reads and writes may correspond to a logical page with a 4 kB size. In the case of a 4 kB logical page, when a user updates a previously stored page new data is appended to a currently open segment, i.e., at a first free 4 kB page within the segment, and an LPT table entry for the logical page is updated to point to the new physical location. In this case, the old version of the logical page (which had been stored in some other segment) is rendered invalid. When a user wants to read a stored logical page, the LPT table is accessed to locate a current physical location where the data is stored. In a typical implementation, the LPT table is stored in Dynamic Random Access Memory (DRAM) for relatively fast access. It should be noted that the implementation of an LSA above a RAID controller 124 or below in storage devices, such as NVM cards 126, entail separate LPTs and the granularity at which the mappings are maintained may differ. For example, an LPT above RAID controller 124 may address logical pages at 32 kB and an LPT in a storage device at 4 kB. Also, the terms logical and physical must be seen in the correct context. In an LSA above RAID controller 124, a logical page relates to an array-level logical page whereas the physical page relates to a logical page on the storage device level which usually does not correspond to a physical NAND flash page. In an LSA implemented in a storage device, the logical page corresponds to a card-level logical page and a physical page to an actual physical NAND flash page. In order to simplify the notation, the term logical-to-physical is used here independent of the actual location of the LSA.

As previously mentioned, at least one conventional data storage architecture has implemented compression below the RAID engine (i.e., data is compressed subsequent to assigning data to storage devices of a storage system by the RAID engine). Implementing storage devices that are capable of compressing data typically results in a more scalable storage architecture with significantly higher overall throughput, as compared to data storage architectures in which storage devices are not capable of compressing data. In data storage architectures in which storage devices are configured to compress data a compression engine may be implemented in software and/or using hardware assists. In data storage architectures, in which a compression engine is implemented using hardware assists, relatively low latencies may be achieved.

However, conventional data storage architectures that perform compression below a RAID engine have usually required more storage capacity to store a same amount of data (as compared to conventional data storage architectures that perform compression above a RAID engine) due to the low compressibility of parity information (i.e., overhead). While overhead may be reduced by increasing a number of storage devices that is organized in a RAID array, increasing the number of storage devices usually increases the probability of an error event (and the probability of an unrecoverable data loss event). In general, increasing the number of storage devices to reduce overhead reduces the reliability of a storage system.

According to aspects of the present disclosure, techniques are disclosed that generally reduce the storage capacity penalty when compression is performed by storage devices of a storage system. According to the present disclosure, techniques are disclosed in which a RAID technology is utilized to organize data in stripes of uncompressed data. The uncompressed data in each data strip of a stripe is compressed and parity information is then calculated on the compressed data, which generally increases storage efficiency with respect to other techniques in which compression is performed below the RAID layer as a size of the parity strip is usually reduced. In one or more embodiments, an LSA is implemented above a storage controller to ensure that all data strips holding compressed logical pages are approximately equal in size to further improve storage efficiency. Implementing an LSA advantageously ensures that overwrites are always written to new locations, stripes are trimmed before reuse, and existing parity information is not modified (and, as such, no parity updates to existing stripes are required and already written data or parity information does not shrink or grow).

Figure 4:
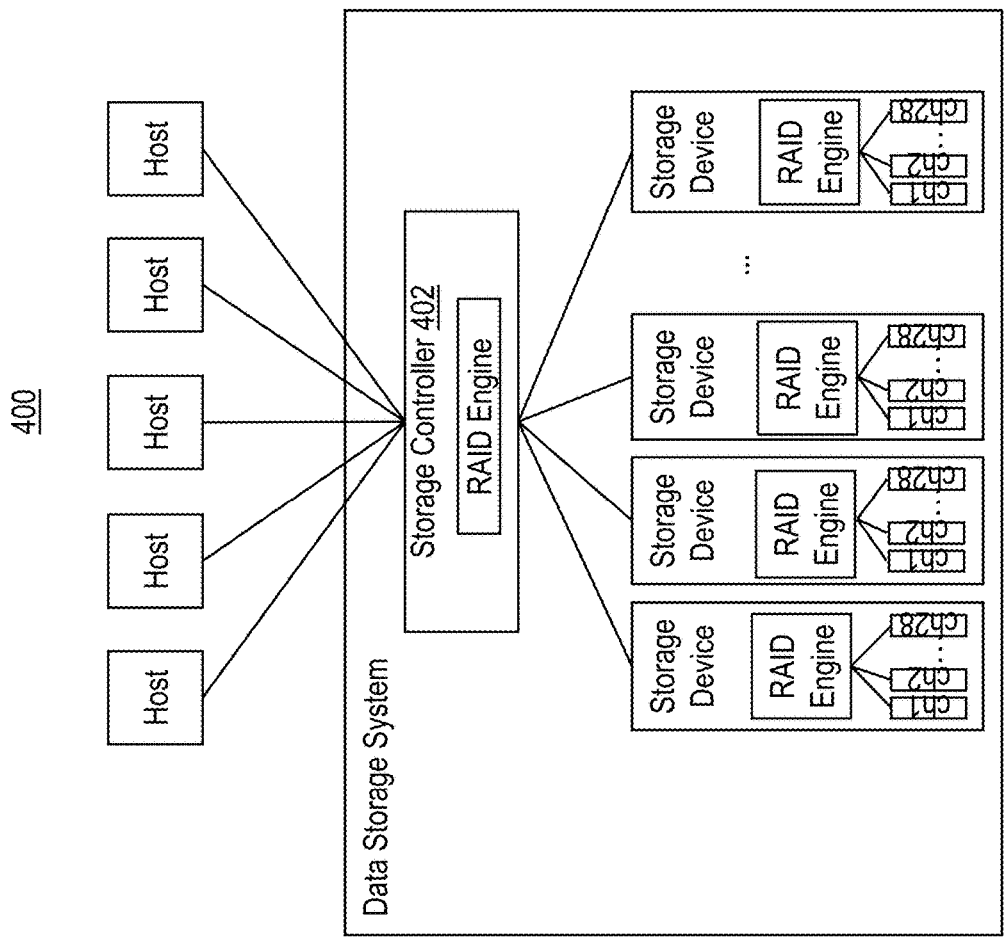
FIG. 4 is a diagram of an exemplary storage system architecture in which compression can be implemented above a Redundant Array of Independent Disks (RAID) engine or below a RAID engine.

With reference to FIG. 4, a relevant portion of an exemplary data storage system architecture 400 is illustrated in which compression can be performed above a RAID engine or below a RAID engine. When storage devices do not support compression, compression may be performed in storage controller 402 above the RAID engine. As previously noted, performing compression above a RAID engine increases latency (e.g., due to streaming architectures not being supported) and increases complexity (e.g., due to two data copies being required). When storage devices support compression, compression capability above the RAID engine can be omitted to reduce cost and improve scalability and performance. However, as previously mentioned, compressing user data below a RAID engine has conventionally resulted in a reduced compression ratio as parity strips have traditionally been substantially incompressible.

Figure 5:
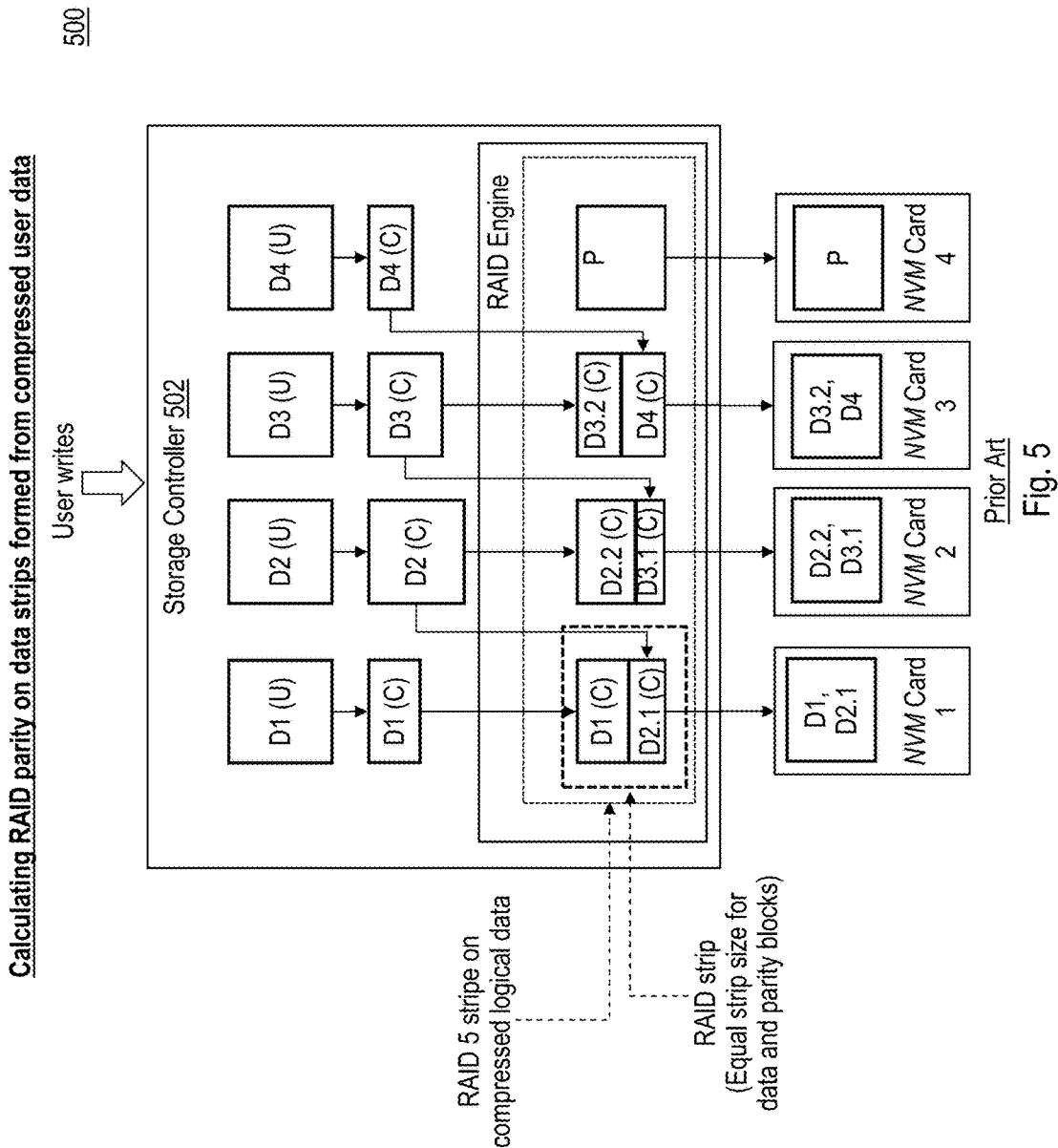
FIG. 5 is a diagram of a relevant portion of an exemplary conventional data storage architecture in which compression is performed above a RAID engine.

With reference to FIG. 5, a relevant portion of an exemplary conventional data storage architecture 500 is illustrated in which logical data D1 (U)-D4 (U) is stored by performing compression above a RAID engine, i.e., a RAID 5 stripe is built from compressed logical data D1 (C)-D4 (C) and each data and parity strip has the same size. It should be noted that due to the compression, some compressed logical data pages are split and stored in different strips (e.g., D2 (C) is split into D2.1 (C) and D2.2 (C), and D3 (C) is split into D3.1 (C) and D3.2 (C)). In this case, the parity strip P may be significantly smaller than when a parity strip is built using uncompressed data. In general, performing compression in the storage controller (in software or using a hardware assist) above the RAID engine scales with the number of controller nodes. However, when performing compression in the storage controller above the RAID engine uncompressed data may have to be copied to a different storage controller to reduce write latency until data is protected by RAID parity calculated on the compressed data.

Figure 6:
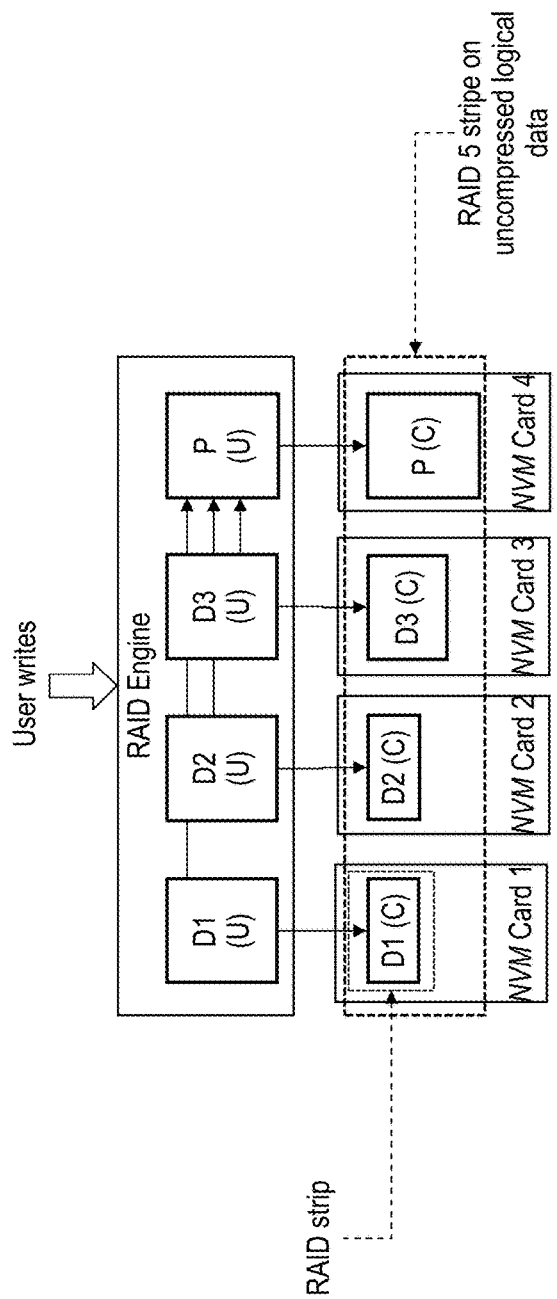
FIG. 6 is a diagram of a relevant portion of another conventional data storage architecture in which compression is performed below a RAID engine.

With reference to FIG. 6, a relevant portion of another conventional data storage architecture 600 is illustrated in which compression is performed below a RAID engine, i.e., a RAID 5 stripe is built with uncompressed logical data D1 (U)-D3 (U) and each data strip is compressed (e.g., logical data D1 (C)-D3 (C)), as well as the compressed parity P (C), when written to a card. As is illustrated, Card 4 stores a parity strip P that due to the nature of the parity calculation algorithm is not compressible or is only marginally compressible. Given that the parity strip P is not compressible (or is only marginally compressible) the parity strip P consumes more storage capacity than the data strips. Since the compression is done by the cards, the size of the compressed data is known and may be maintained in the card for each LBA (thus, no additional higher level metadata is required to track the size of the compressed data). In architecture 600, user data writes D1 (U)-D3 (U) are first written to storage controller cache. The storage controller then segments the user data into RAID 5 stripes and computes parity P (U). Each strip of a stripe is then written to a different card and each card compresses an associated RAID strip independent of the other cards (e.g., D1 (C)-D3 (C) and P (C)). It should be appreciated that Card 4 attempts to compress the parity strip 'P (U)' but due to the nature of the parity calculation algorithm the parity strip is not compressible (or is only marginally compressible) and, as such, the parity strip P (C) consumes more storage capacity than each of the data strips D1 (C)-D3 (C). The more compressible the data strips, the larger the relative overhead utilized by the parity strip.

Figure 7:
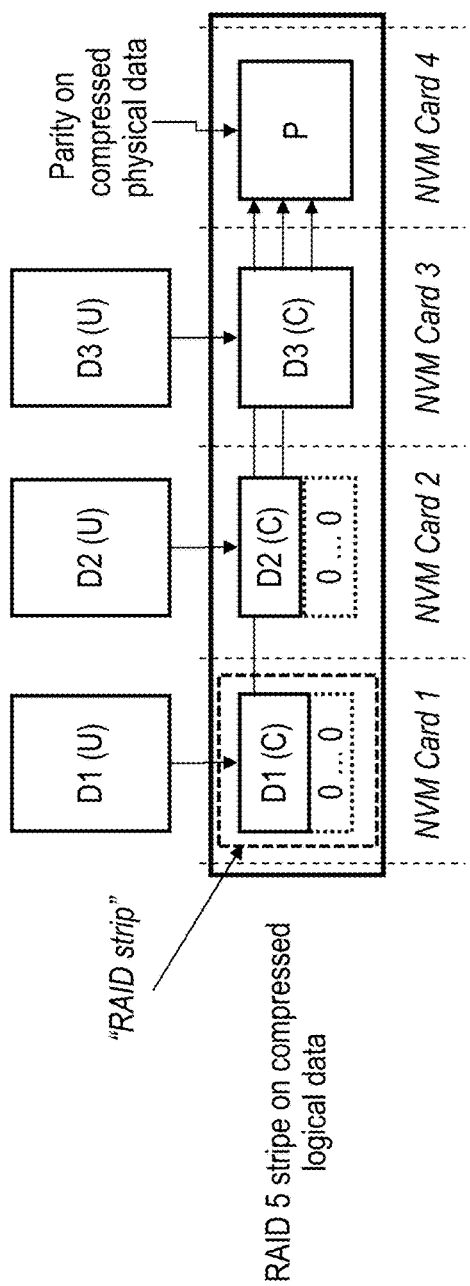
FIG. 7 depicts a diagram of a relevant portion of a data storage architecture in which compression below a RAID engine is performed according to an embodiment of the present disclosure.

According to aspects of the present disclosure, techniques are disclosed that can leverage storage device compression engines with low latency to reduce the compression ratio penalty attributable to limited compressibility of a RAID parity strip, while taking advantage of the decentralized storage devices. With reference to FIG. 7, a relevant portion of a data storage architecture 700 is illustrated in which compression below a RAID engine employs RAID 5 with stripes built from compressed data D1 (C)-D3 (C). Parity strip P is significantly smaller (as compared to architectures in which parity information is built from uncompressed data), as the parity information is built from compressed data. A size of the parity strip P corresponds to the size of the largest compressed data strip in the stripe. For parity calculations, all compressed data strips smaller than the largest compressed data strip are padded with zeroes to be the same size as the largest compressed data strip. It should be appreciated that zeroes added for parity calculations are not stored in a card and that the compressed data strips may have different sizes (that may be maintained by each card). It should be appreciated that data patterns other than zeros may be used for the padding.

Figure 8:
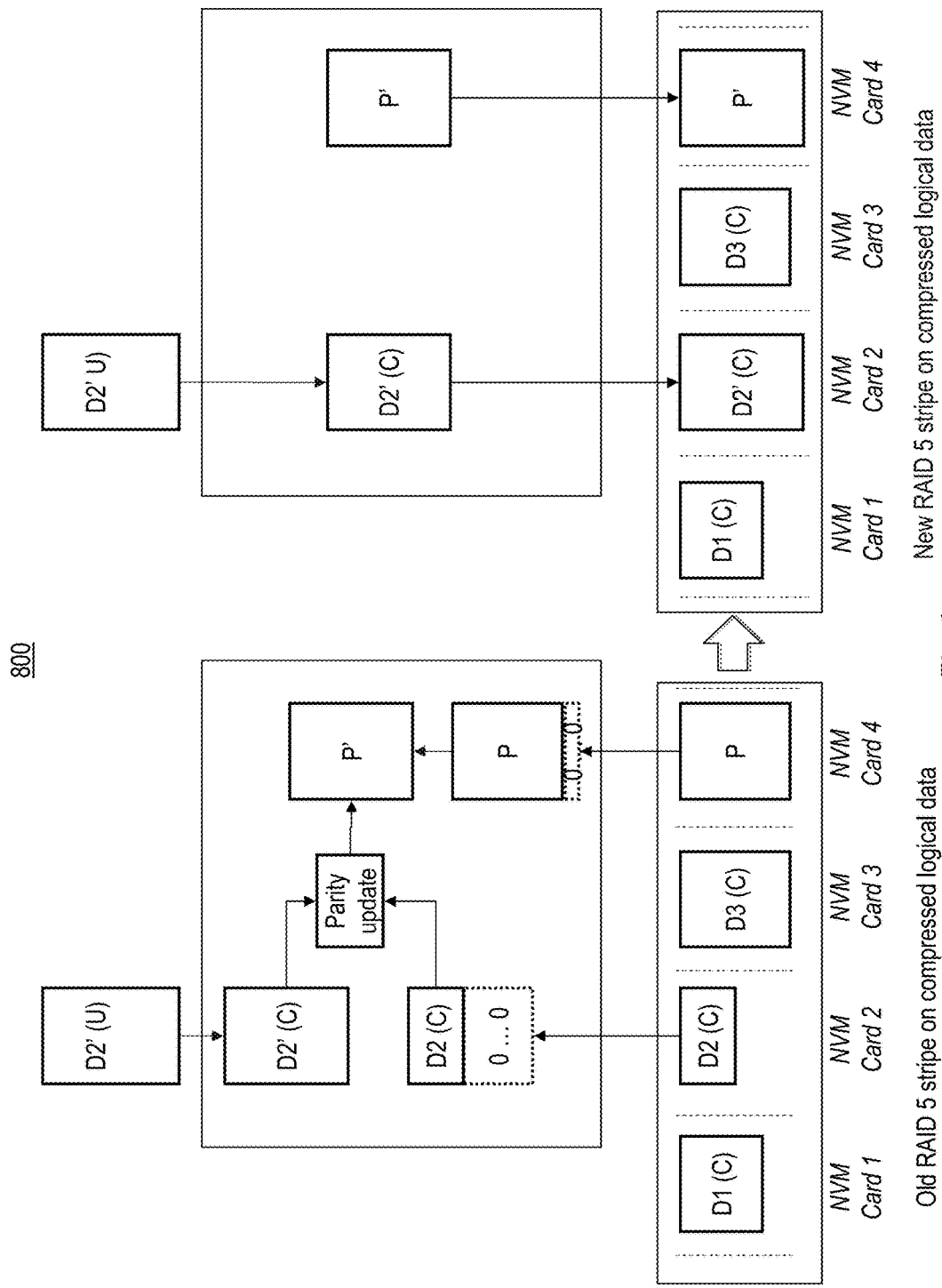
FIG. 8 depicts a relevant portion of a data storage architecture in which a data strip in a stripe is overwritten and parity is updated according to one aspect of the present disclosure.

With reference to FIG. 8, a relevant portion of a data storage architecture 800, configured according to the present disclosure, is illustrated in which a data strip D2 in a stripe is overwritten and parity is updated. More specifically, the case where new compressed data strip D2' is larger than an old compressed data strip D2 is illustrated. As shown, when the new compressed data strip D2' is larger than the old compressed data strip D2 the following operations are initiated: the old compressed data strip D2 and an old parity strip P are read and padded with zeroes, if needed; a parity update is performed to generate a new parity strip P'; and the new compressed data strip D2' and the new parity strip P' are written to their respective cards.

In the event a new data strip has the same compressed size or is smaller than an associated old data strip, the update is relatively straight forward. That is, when the new data strip has the same compressed size or a smaller compressed size than the old data strip the old data strip and the old parity strip are read from their respective storage devices and XORed with the new data strip (which is padded with zeroes for the parity calculation if the compressed size of the new data strip is smaller than the old data strip). The new parity strip is written to the storage device that stored the old parity strip and the new data strip is written to the storage device that stored the old data strip.

In certain cases when the compressed new data strip is smaller than the compressed old data strip and the new data strip is the largest data strip the parity strip may shrink. The shrinking of the parity strip may or may not affect data protection. In the event the parity strip remains the same size, the dispensable bits are at the end and all zero. In this case, the dispensable bits may be written to the storage device together with the parity information. The compressor in the storage device may then compress the parity information by removing the zeroes such that no or very little space is wasted. In the event the parity strip is not compressed in the storage device some space is wasted but data integrity is guaranteed. The above approach can be extended to stripes holding multiple logical pages per strip and where any logical page is updated in a data strip. When the updated page does not have the same size as the original page, reading the old data strip includes reading the old page and all pages following the old page to perform the parity update operation. The same operations apply for the parity strip.

When updating data strips it can be beneficial to have an associated compressed data size in a header of the compressed data strip. For example, if data strip D1 is lost and has to be recovered (computed) from the parity strip P and the data strips D2 and D3, then the entire D1 data strip must be recovered. However, in this case, there are zeroes appended after the D1 data which need to be removed during recovery. One way to remove the padded zeroes is to have a decompression engine identify the situation using compression metadata. In this case, during data recovery all data is routed through the decompression engine so that the decompression engine can identify when the entire D1 data is recovered and the padded zeroes start. The padded zeroes added for parity calculation can then be removed from the recovered D1 data, and D1 data can be correctly written without the padded zeroes.

In the event an implemented decompression engine is not capable of accurately identifying the end of the compressed data, each compressed strip can be prepended with its size. In this manner, when data of the D1 data strip is recovered from data in the D2 and D3 data strips and the parity strip P all padded zeroes after the stored size for the D1 data strip can be removed from the D1 data strip. In data storage systems that employ LSA data organization compression may be maximized and/or certain operations may be simplified. As one example, if stripes are always garbage collected and trimmed before being written there is no need to perform read-modify-write on data and parity upon small updates. Small updates can then simply be written to a new location and the problem of growing or shrinking user data or parity does not exist.

In general, for data storage systems that employ LSA data organization it is desirable to utilize relatively large strip sizes such that a strip includes a relatively large number of compressed pages. As an LPT table is maintained for LSA data organization, the placement of a logical page into a stripe can be freely chosen (and rearranged) before being written to the storage devices. Therefore, data placement can be optimized such that data reduction is maximized, which is the case when the sum of all compressed page sizes in all strips are approximately of the same size. Although the disclosure focuses on RAID 5 the disclosed techniques can be easily adapted to other RAID levels (e.g., RAID 6 where space savings are higher than with RAID 5 due to the requirement of storing additional parity information).

With reference to FIG. 9, an exemplary process 900 is illustrated that generally increases storage efficiency of a data protection technique, according to the present disclosure. It should be appreciated that portions of process 900 may be performed by one or more controllers (e.g., RAID controller 124 and NVM controllers 140 of allocated NVM cards 126) of data storage system 120 depending on how data storage system 120 is ultimately configured. Process 900 may be initiated in block 902 by, for example, RAID controller 124 in response to RAID controller 124 receiving a communication from a host (e.g., a processor system 102). Next, in decision block 904, RAID controller 124 determines whether the communication corresponds to receipt of uncompressed user data. In response to the received communication not corresponding to receipt of uncompressed user data control transfers from block 904 to block 914, where process 900 terminates. In response to the received communication corresponding to receipt of uncompressed user data control transfers from block 904 to block 906.

In block 906, RAID controller 124 organizes the received uncompressed data into data strips of a stripe by, for example, executing an associated RAID engine, and then transfers the data strips to respective NVM cards 126. Next, in block 908, NVM controllers 140 (of respective NVM cards 126) initiate compression on their respective data strips by compressors 300. Then, in block 910 parity information is calculated for the compressed data strips and the parity information is transferred to a designated NVM card 126 for storage. This can be done by calculating the parity information on a RAID controller 124 where data is being compressed in the background by a compressor in RAID controller 124, or by reading or receiving the compressed data from respective NVM cards 126. Alternatively, the transferring of the data strips to NVM cards 126 may use write duplication, where the data to be written is in addition transferred to an NVM card 126 storing the parity, or NVM cards 126 performing the compression of the data strips may send the compressed data directly to an NVM card 126 holding the parity. In this alternative, the parity may be calculated directly on an NVM card 126 storing the parity. Next, in block 912, RAID controller 124 initiates storage of the data strips and the parity information (in the form of a parity strip) by NVM controllers 140 in respective storage devices (NVM systems 150) of NVM cards 126. From block 912 control transfers to block 914 where process 900 terminates.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a NVM controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transmission media per se, transitory propagating signals per se, and forms of energy per se.

In addition, although embodiments have been described that include use of an NVM such as a phase change memory (PCM), it should be appreciated that embodiments of the present invention can also be used with other types of non-volatile random access memory (NVRAM) including, for example, flash memory, as well as traditional rotational hard drives (HDDs), shingled magnetic recording hard disk drives (SMR HDDs) and combinations thereof.

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of operating a data storage system that includes multiple storage devices, comprising:
   receiving, by a first controller, uncompressed data;
   organizing, by the first controller, the uncompressed data into data strips of a stripe;
   compressing, by second controllers that are each associated with a different one of the storage devices, the data strips of the stripe;
   calculating, by the first controller, parity information for the data strips subsequent to the compressing, wherein calculating the parity information for the data strips subsequent to the compressing increases efficiency of the data storage system by reducing a size of the parity information; and
   initiating, by the second controllers, storing of the compressed data strips and the parity information for the stripe on the storage devices of the data storage system.

2. The method of claim 1, further comprising:
   determining a size of a largest one of the data strips in the stripe; and
   padding remaining ones of the data strips in the stripe with zeroes such that all of the data strips in the stripe are a same size prior to calculating the parity information.

3. The method of claim 1, further comprising:
   performing log-structured array (LSA) data organization on the uncompressed data prior to the uncompressed data being organized into the data strips of the stripe.

4. The method of claim 3, wherein the received uncompressed data is organized into the data strips using a Redundant Array of Independent Disks (RAID) engine.

5. The method of claim 3, wherein the first controller is implemented in a storage controller.

6. The method of claim 5, wherein the first controller implements a Redundant Array of Independent Disks (RAID) engine that is configured to organize the uncompressed data into the data strips of the stripe.

7. The method of claim 5, wherein the second controllers are each configured to compress one of the data strips of the stripe.

8. A data storage system that includes multiple storage devices, comprising:
   a non-volatile memory (NVM) array; and
   one or more controllers coupled to the NVM array, wherein the one or more controllers include a first controller and second controllers, and wherein the one or more controllers are configured to:
      receive, by the first controller, uncompressed data;
      organize, by the first controller, the uncompressed data into data strips of a stripe;
      compress, by the second controllers that are each associated with a different one of the storage devices, the data strips of the stripe in the storage devices;
      calculate, by the first controller, parity information for the data strips subsequent to the compressing, wherein calculating the parity information for the data strips subsequent to the compressing increases efficiency of the data storage system by reducing a size of the parity information; and
      initiate, by the second controllers, storing of the compressed data strips and the parity information for the stripe on the storage devices of the data storage system.

9. The data storage system of claim 8, wherein the one or more controllers are further configured to:
   determine a size of a largest one of the data strips in the stripe; and
   pad remaining ones of the data strips in the stripe with zeroes such that all of the data strips in the stripe are a same size prior to calculating the parity information.

10. The data storage system of claim 8, wherein at least one of the one or more controllers are further configured to:
    perform Log-Structured Array (LSA) data organization on the uncompressed data prior to the uncompressed data being organized into the data strips of the stripe.

11. The data storage system of claim 10, wherein the received uncompressed data is organized into the data strips using a Redundant Array of Independent Disk (RAID) engine.

12. The data storage system of claim 10, wherein the first controller is implemented at a storage controller level.

13. The data storage system of claim 12, wherein the first controller implements a Redundant Array of Independent Disks (RAID) engine that is configured to organize the uncompressed data into the data strips of the stripe.

14. The data storage system of claim 12, wherein the second controllers are each configured to compress one of the data strips of the stripe.

15. A computer program product, the computer program product comprising a computer readable storage medium having program instructions embodied therein, the program instructions executable by one or more controllers, that include a first controller and second controllers, of a data storage system that includes multiple storage devices, to cause the one or more controllers to:
    receive, by the first controller, uncompressed data;
    organize, by the first controller, the uncompressed data into data strips of a stripe;
    compress, by the second controllers that are each associated with a different one of the storage devices, the data strips of the stripe in the storage devices;

calculate, by the first controller, parity information for the data strips subsequent to the compressing, wherein calculating the parity information for the data strips subsequent to the compressing increases efficiency of the data storage system by reducing a size of the parity information; and initiate, by the second controllers, storing of the compressed data strips and the parity information for the stripe on the storage devices of the data storage system.

16. The computer program product of claim 15, wherein the program instructions are further configured to cause the one or more controllers to:

determine a size of a largest one of the data strips in the stripe; and pad remaining ones of the data strips in the stripe with zeroes such that all of the data strips in the stripe are a same size prior to calculating the parity information.

17. The computer program product of claim 15, wherein the program instructions are further configured to cause at least one of the one or more controllers to:

perform Log-Structured Array (LSA) data organization on the uncompressed data prior to the uncompressed data being organized into the data strips of the stripe.

18. The computer program product of claim 17, wherein the received uncompressed data is organized into the data strips using a Redundant Array of Independent Disks (RAID) engine.

19. The computer program product of claim 17, wherein the first controller is implemented in a storage controller.

20. The computer program product of claim 19, wherein the first controller implements a Redundant Array of Independent Disks (RAID) engine that is configured to organize the uncompressed data into the data strips of the stripe, and wherein the second controllers are each configured to compress one of the data strips of the stripe.

* * * * *